United States Patent [19]
Borrello

[11] 3,963,926
[45] June 15, 1976

[54] DETECTOR COLD SHIELD

[75] Inventor: Sebastian R. Borrello, Richardson, Tex.

[73] Assignee: Texas Instruments Incorporated, Dallas, Tex.

[22] Filed: Jan. 9, 1975

[21] Appl. No.: 539,893

[52] U.S. Cl. ............... 250/338; 250/332; 250/334; 250/370
[51] Int. Cl.² ......................... H01J 31/49
[58] Field of Search .......... 250/332, 334, 342, 347, 250/349, 352, 353, 338, 370

[56] References Cited
UNITED STATES PATENTS

| | | | |
|---|---|---|---|
| 3,351,756 | 11/1967 | Kallett | 250/349 |
| 3,397,314 | 8/1968 | Weiner | 250/349 |
| 3,611,385 | 10/1971 | McHenry | 250/342 |
| 3,633,031 | 1/1972 | Pesce | 250/349 |

OTHER PUBLICATIONS

"Nanosecond Response Time . . . " by Contreras et al., Applied Physics Letters, Nov. 15, 1970, vol. 17, No. 10, pp. 450–453.

"Semiconductors" by Wolf, pp. 132, 133, 134, published 1971.

"Semiconductor Window for Infrared Detector" by Lyons et al., IBM Tech. Discl. Bulletin, vol. 2, No. 5, Feb. 1960, pp. 97, 98.

"Pluggable Solar Cell" by Crawford et al., IBM Technical Discl. Bulletin, vol. 4, No. 11, Apr. 1962, p. 62.

*Primary Examiner*—Harold A. Dixon
*Attorney, Agent, or Firm*—Harold Levine; Rene' E. Grossman; Alva H. Bandy

[57] ABSTRACT

A thermal energy receiver is disclosed comprising a cooling means for cooling an infrared detector including a detector array for producing electrical representations of thermal energy radiating from a scene and an array of cold shields providing an individual cold shield aperture for substantially shielding each detector element of the array from energy generated outside the solid angle subtended by the optical elements, and electro-optics for converting the electrical output of the detector array to visual signals for displaying the scene.

8 Claims, 12 Drawing Figures

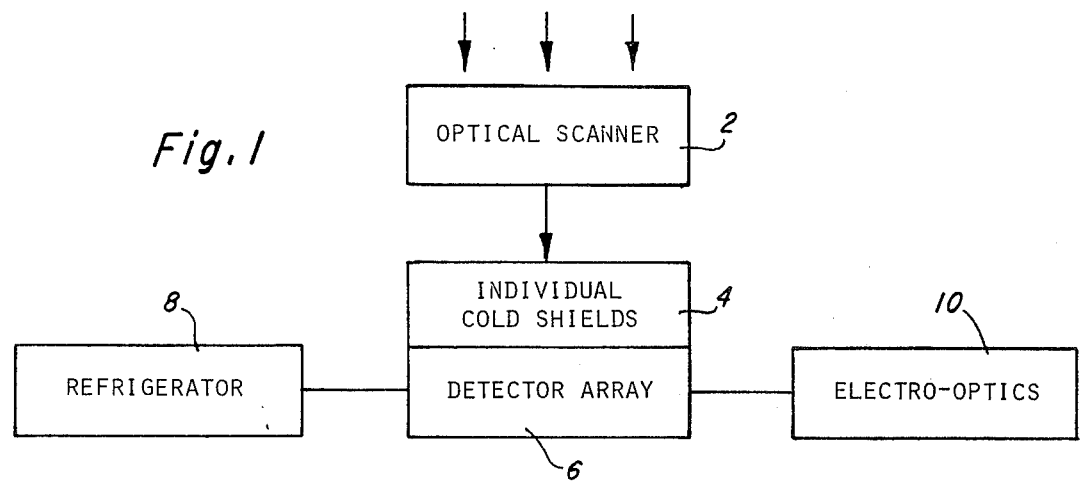
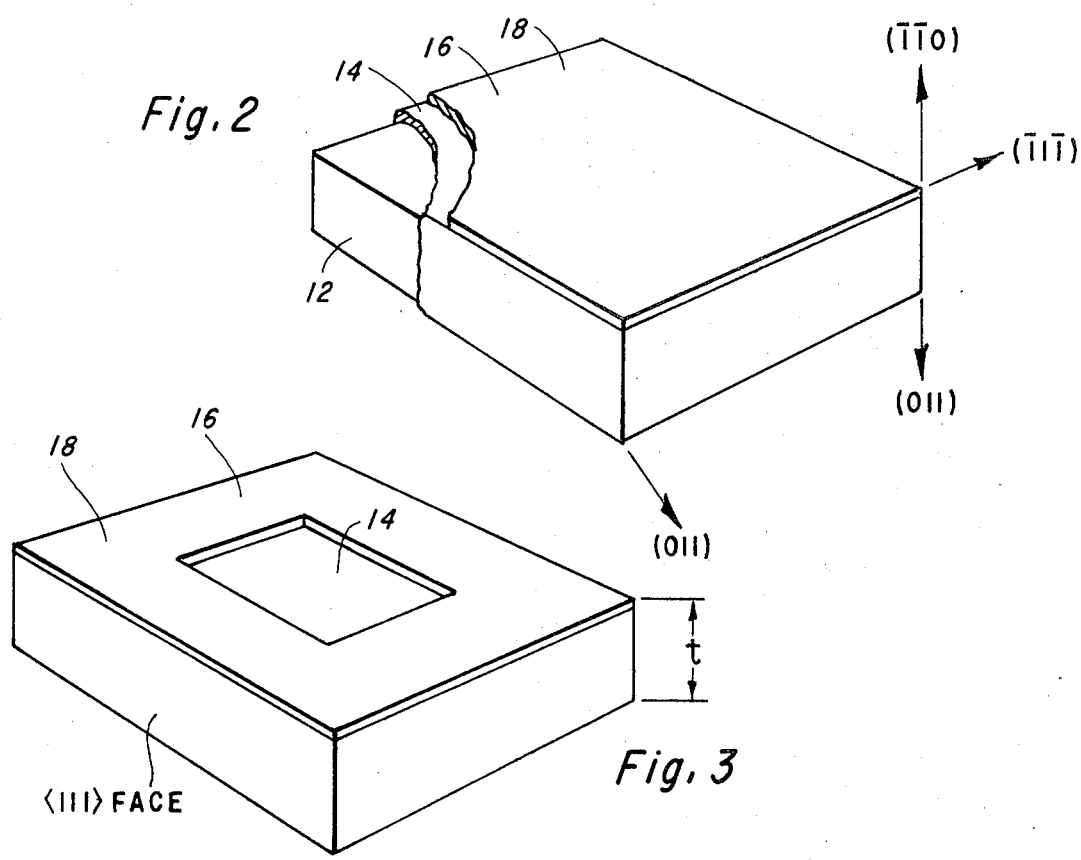

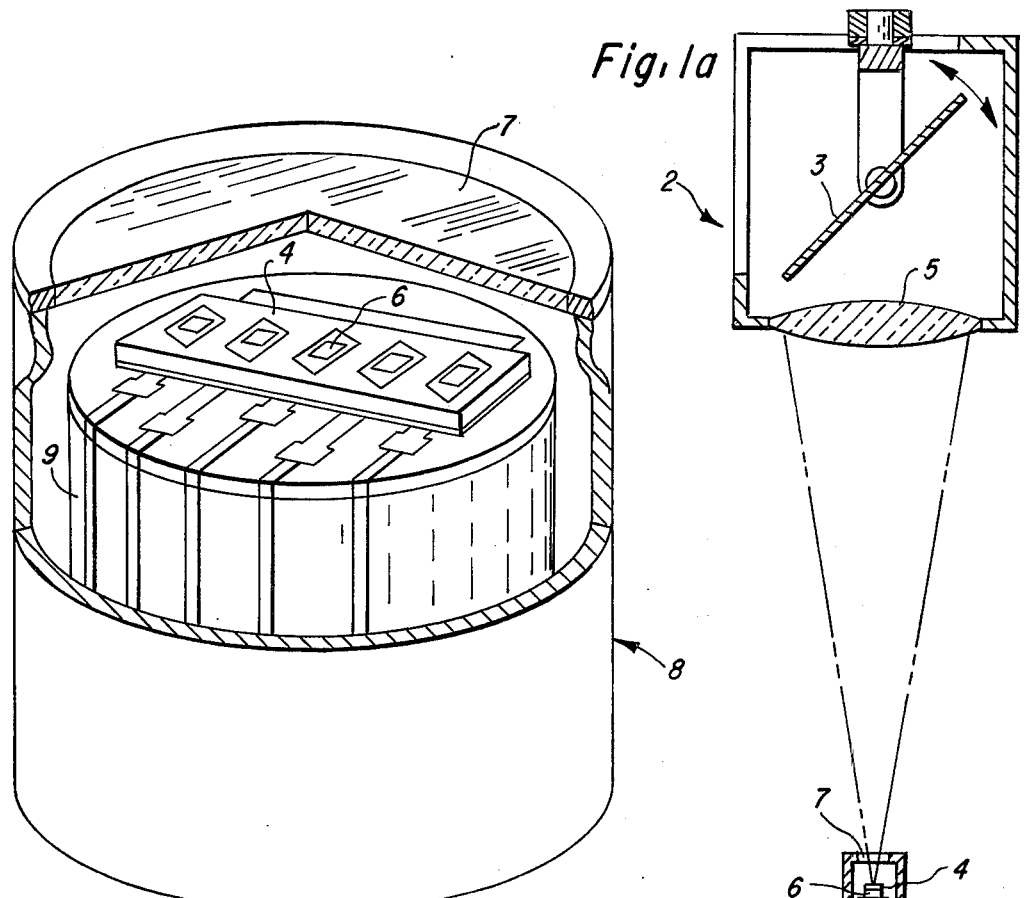
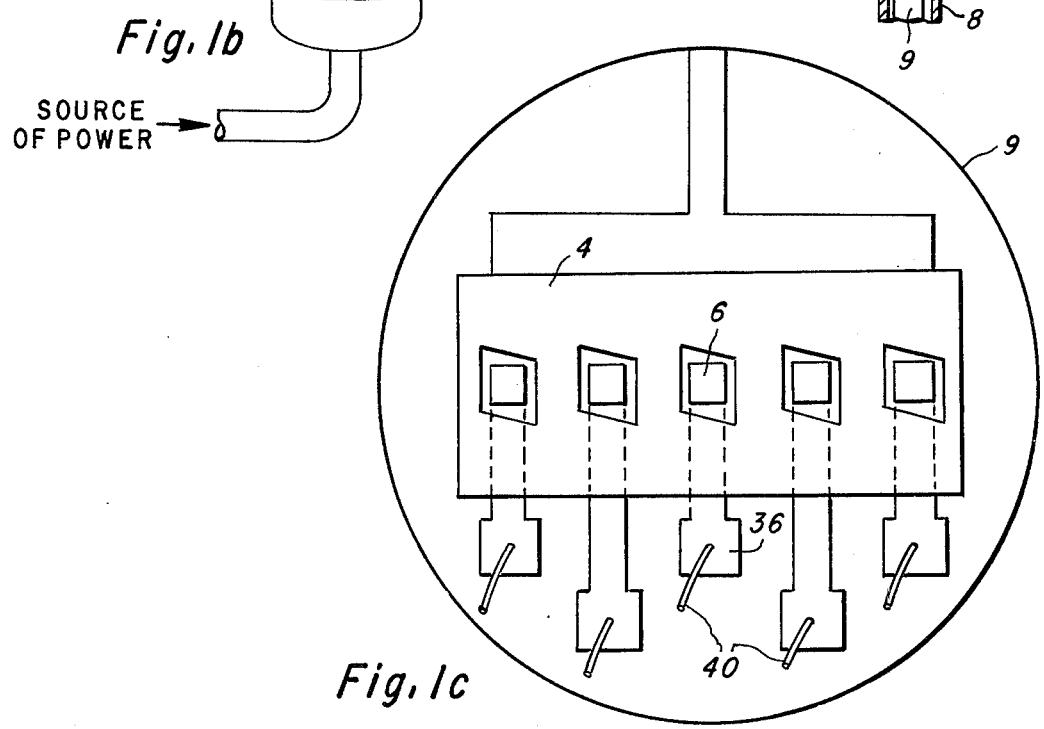
Fig. 1a
Fig. 1b
SOURCE OF POWER
Fig. 1c

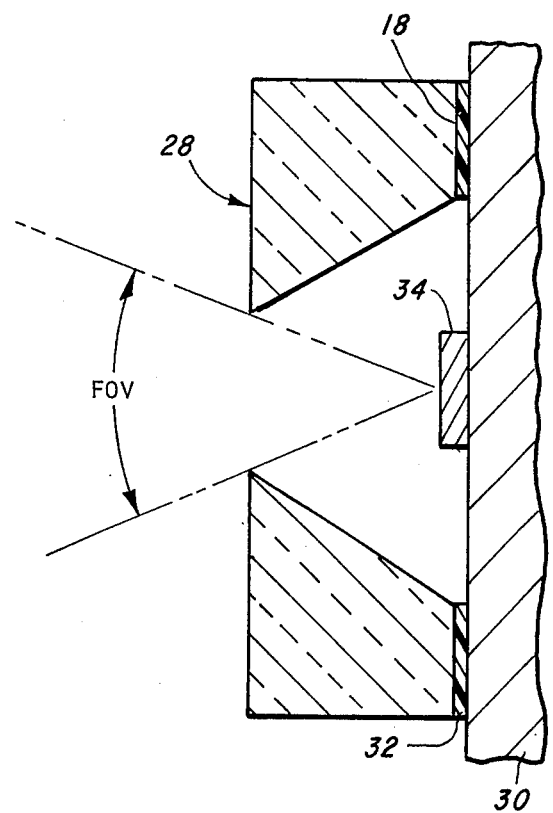
*Fig. 8*
*Fig. 9*
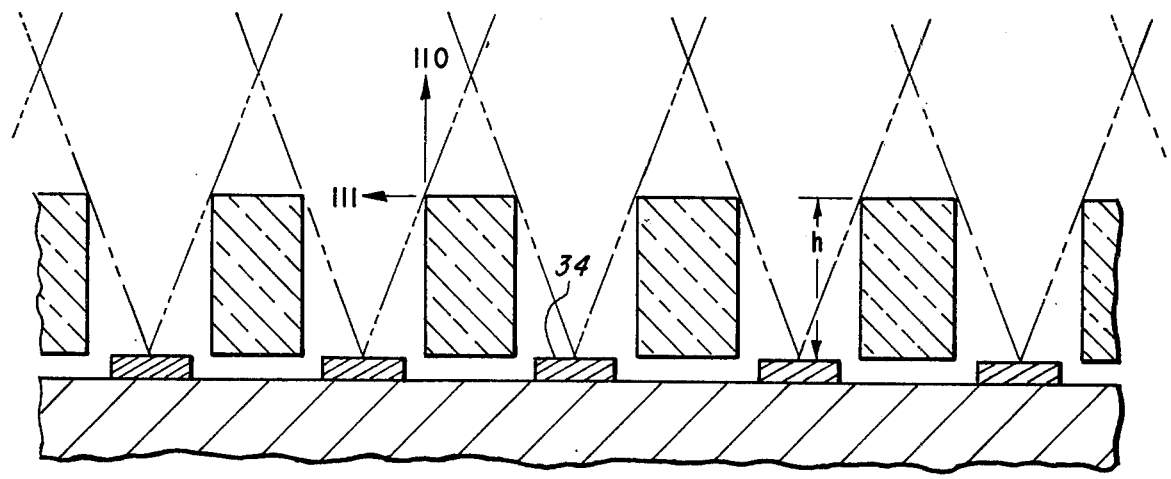

DETECTOR COLD SHIELD

This invention relates to thermal energy receivers, and more particularly, to an infrared receiver having an improved detector head.

In the past, infrared detector arrays having a plurality of detector elements have used either a single cold shield of high emissivity apertures, or a reflective shield of low emissivity apertures, to increase the detector's sensitivity, $D^=$, by reducing the number of photons per second absorbed by the detector.

The cold shields were usually constructed of metal placed either in thermal contact with the detector substrate or the coolant chamber. For a linear detector array, a single cold shield for the array has an aperture which provides maximum efficiency in one dimension only, that is, the sides parallel to the linear array of detector elements shield each element of the detector array for maximum efficiency. In the other dimension, that is, transverse to the linear array, shielding is poor for all elements to avoid obstruction of the energy focused by the collecting optics. Thus, the field of view is restricted to the solid angle subtended by the system collecting optics in one dimension only leaving the transverse dimension of the detector array subject to photons generated outside the optical field of view. The efficiency in the transverse dimension can be improved by extending the length of the cold shield toward the optics; nevertheless, the length must be several times the array length to be very effective.

The reflective shields comprise coating the inside of the detector window with a reflective coating to restrict the window opening to the optical field of view area. The advantage of this system is that it operates at ambient temperature and is easy to manufacture. Its disadvantage is that it is an inefficient shield as extraneous photons generated along the dewar stem are reflected from the back side of the reflector optics onto the detector thereby reducing the signal to noise ratio. Further it does not effectively solve the transverse problem previously mentioned.

Accordingly, it is an object of this invention to provide an improved thermal energy receiver.

Another object of the invention is to improve the signal to noise ratio of the detector array of the thermal energy receiver.

Still another object of the invention is to provide a cold shield array for the detector array.

A further object of the invention is to provide an individual cold shield for shielding each element in a detector array from photons generated outside the solid angle subtended by the system collecting optics.

Briefly stated the improved thermal energy receiver comprises a cryogenic cooler or refrigerator, an optical scanner, a detector array means including a detector array and a cold shield array, and an electro-optics module. The detector cold shield array consists essentially of a body of absorbing or reflecting material having a plurality of apertures formed therein; the number of apertures corresponding to the number of detector elements. The walls of each aperture of the cold shield restrict the field of view of each detector element to the solid angle subtended by the system collecting optics thereby causing a reduction in background photon density at the detector surface. The hole pattern may be created in amorphous materials such as, for example, metal, plastic, glass, rubber, or in a crystalline material such as, for example, silicon, germanium, gallium arsenide, or silicon dioxide.

These and other objects and features of the invention will become more readily understood in the following detailed description taken in conjunction with the drawings in which:

FIG. 1 is a block diagram of the thermal energy receiver constituting the subject matter of this invention;

FIG. 1a is a partial cross-sectional view of the thermal energy receiver shown in block view in FIG. 1;

FIG. 1b is a greatly enlarged isometric view of the cooler having a portion of the housing cut away to show the relationship of the cooler to the cold shield/detector arrays;

FIG. 1c is a plan view of the device of FIG. 1b with the cooler housing removed.

FIG. 2 is a partial view of a crystalline block with orientation as shown and with a portion broken away to show the protective oxide coating of the crystalline block and the layer of resist material applied to the upper surface;

FIG. 3 is a partial isometric view of the silicon substrate of FIG. 1 showing the etch pattern developed in the layer of resist material;

FIG. 8 is an end view in cross section of the detector array with the cold shield attached;

FIG. 9 is a partial side view in cross section of the detector array with the array of individual cold shields attached;

Figure 4:
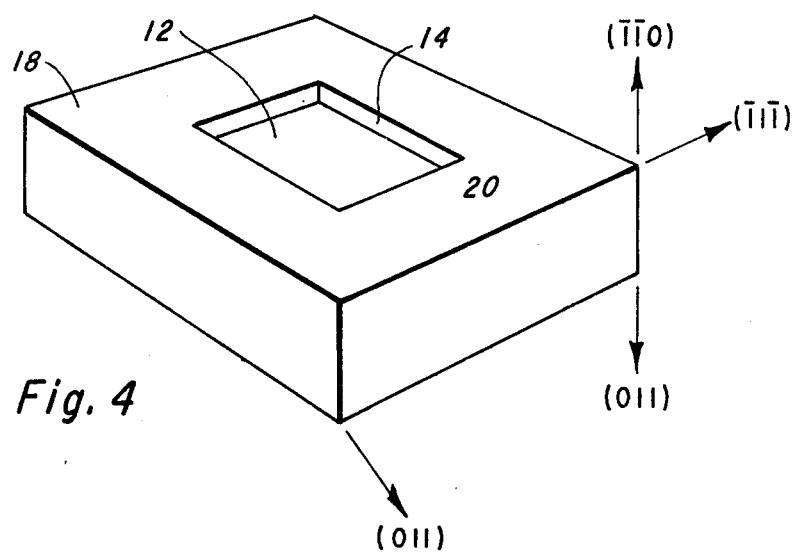
FIG. 4 is a partial isometric view of the crystalline substrate of FIG. 2 showing the hole pattern etched in the crystalline oxide after removal of the resist material.

Referring to the drawings, the improved thermal radiation receiver is shown in FIG. 1 as a block diagram to illustrate the operational relationship of the major components. The thermal radiation receiver (FIG. 1) comprises an optical scanner 2, detector cold shield array 4, detector array 6, refrigerator 8 and electro-optics 10. The optical scanner 2 (FIGS. 1a, b, and c) scans by mirror 3 pivotally mounted in a housing; a scene radiating thermal energy and provides a field of view or path of incoming thermal energy through collecting optics 5 and infrared window 7 of Dewar or cooler 8. The individual cold shield array 4 mounted in Dewar 8 shields a detector array 6 to which the cold shield array is attached from extraneous radiant energy or noise. The detector array 6 is mounted on the cold finger 9 in the path of the incoming thermal energy scanned by the optical scanner 2, and when cooled to its operating temperature by the Dewar or refrigerator 8, produces electrical signals representative of the thermal energy image impinging thereon. The electrical signals of the detector array 6 are amplified and processed for visual display in a selected one of many electro-optical systems 10. As those skilled in the art are familiar with the elements of the thermal energy receiver, no detailed description thereof is given. Those persons desiring a more detailed description are referred to U.S. Pat. No. 3,742,238 issued June 26, 1973.

The array of individual cold shields 4 may be fabricated from sheets of metal, plastic, or other radiant energy absorbing materials by punching, milling, or blanking operations depending upon the size and spacing of the detector elements of the detector array 6. For detectors fabricated from semiconductor materials such as, for example, mercury-cadmium-telluride, or lead-tin-telluride, a cold shield array fabricated from crystalline meterials such as, for example, silicon or germanium constitutes the preferred embodiment of the invention.

For example, in the preferred embodiment the array of individual cold shields is fabricated (FIG. 2) from a slice of crystalline material. The thickness of the slice determines the heighth of the array of the individual cold shields. The height of the array is determined by the optics as follows. An infrared receiver having an F/10 optics (FIG. 9) provides a potential of better than $20x$ improvement in $D^=$. An array of 500 detector elements on 0.10 mm centers has a corresponding number of individual cold shields having 20 $\mu$m thick walls located 0.04 mm from the detector element centers. For the F/10 angle a cold shield height or slice thickness of about 0.8 mm ($20 \times 0.04$ mm=0.8 mm) is required to limit detector reception to the field of view of the optical scanner.

To protect the detector elements from radiant energy striking the walls of the array of individual cold shields the fabrication material must be absorptive. Adequate absorption for silicon is provided by doping the silicon with a p-type material such as, for example, boron, indium or gallium to a concentration of $10^{18}$ cm$^{-3}$ to provide at a 10 $\mu$m wavelength radiant energy absorption coefficient of $10^3$ cm$-1$. A 20 $\mu$m thick wall transmits less than 15 percent at 10 $\mu$m wavelength, effectively reducing the extraneous photon flux.

The preferred method of fabricating the array of individual cold shields utilizes a preferential etch, hereinafter described, to form the apertures therein for the detector elements. For preferential etching the doped silicon slice 12 has a preselected crystal orientation such as the 111 Miller indices shown in FIG. 2. The surfaces of the slice 12 are oxidized by any suitable method such as the steam process, well known to those skilled in the semiconductor materials art, to form a continuous layer of silicon oxide 14. A suitable photoresist 16 such as that sold under the trademark KTFR by Eastman Kodak Company is deposited on a major surface 18 of the silicon oxide layer 14. The layer of resist 16 is masked with a preselected hole pattern, exposed and developed to form a selected hole pattern (FIG. 3) in surface 14 of the silicon oxide layer 12. After etching the hole pattern in the silicon oxide layer 14, the developed resist layer 16 is removed from the surface of the silicon oxide layer 14 to expose the oxide layer defining the holes 20 of the hole pattern (FIG. 4).

The hole patterned silicon slice 12 is then placed in a preferential etch solution to etch holes through the crystalline body 12. For the silicon substrate oriented with respect to the {111} and {110} planes a 50 percent potassium hydroxide (KOH) solution is used to etch the holes. For a more specific description of the above-mentioned steps of the invention to preferentially etch the hole pattern in the crystalline substrate, reference is made to U.S. Pat. No. 3,579,057 issued May 18, 1971.

Figure 5:
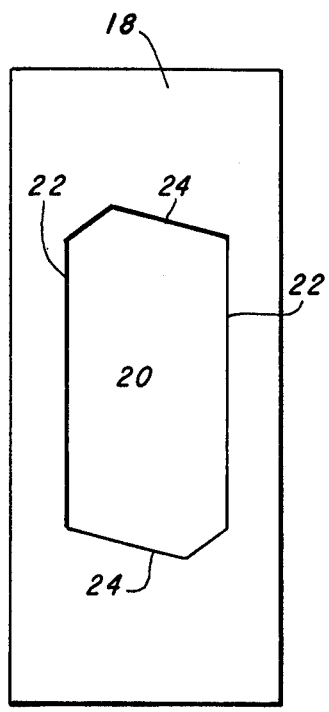
FIG. 5 is a plan view of the first surface of the crystalline substrate of FIG. 3 after etching.
Figure 6:
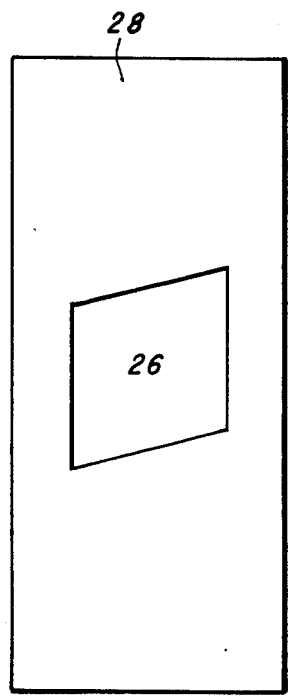
FIG. 6 is a plan view of the last surface of the crystalline substrate of FIG. 3 to be etched.
Figure 7:
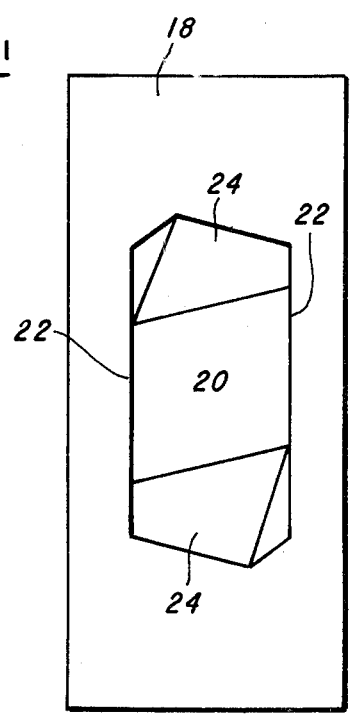
FIG. 7 is a plan view of the aperture etched in the substrate of FIG. 3.
Figure 10:
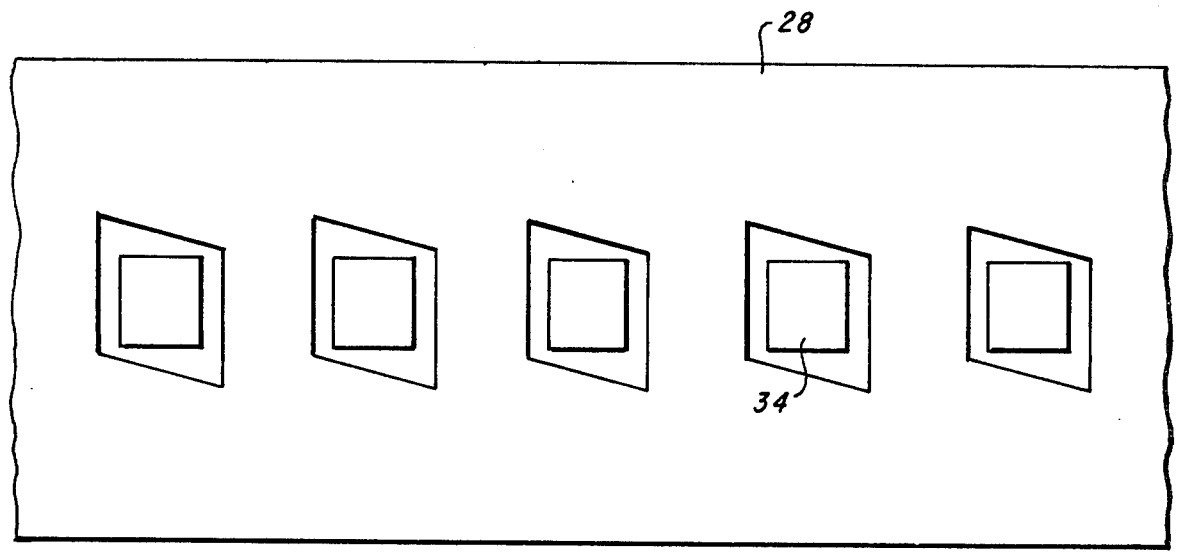
FIG. 10 is a partial top view of the detector array with the array of individual cold shields attached.
Figure 11:
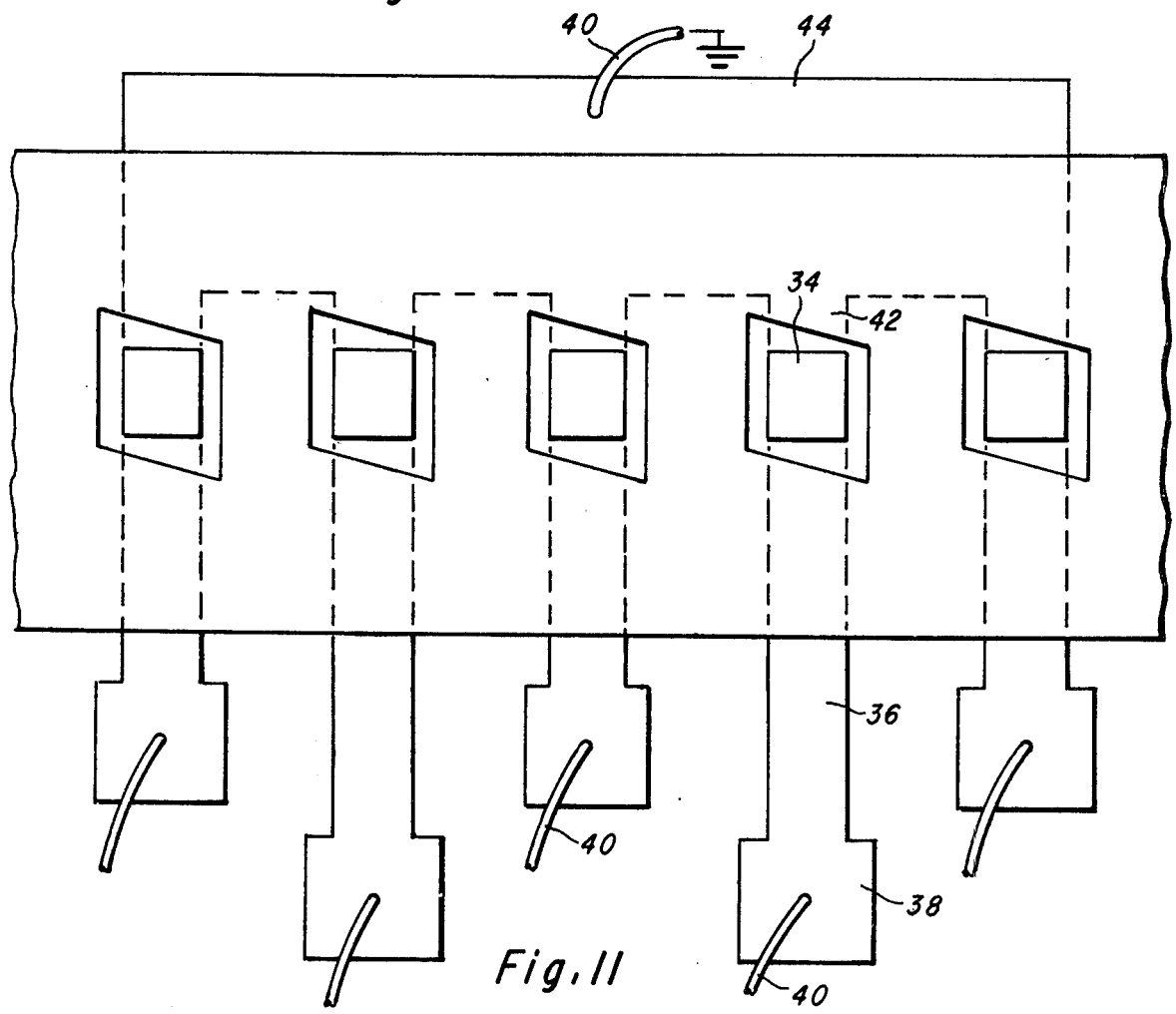
FIG. 11 is a partial plan view of the detector array showing lead interconnects and the array of cold shields attached.

With the orientation of the substrate as shown in FIG. 2 and the 50 percent KOH etch solution, the holes 20 of the etched hole pattern have openings in surface 18 shaped as shown in FIG. 5. Sides 22 of each hole of the array etch in a vertical plane to form vertical walls for the holes (FIG. 9); however, sides 24 thereof etch to the intersection of the {111} plane with the 110 plane to undercut slightly the oxide pattern as shown in FIG. 5, and then etch downwardly and inwardly to form with the vertical walls 22 a parallelogram shaped opening 26 in surface 28 for each hole as shown in FIG. 6. Thus, each aperture 20 of the cold shield array (FIGS. 9 and 10) has a plan view substantially as shown in FIG. 7. The parallelogram shaped openings 26 (FIG. 6) have acute angles of about 54° and obtuse angles of about 126° and the sloping surfaces 24 of the apertures 20 form a 30° angle with surface 28 (FIG. 8).

After the apertures are formed in the cold shield, surface 18 (FIG. 8) of the cold shield is attached to the surface of the detector supporting substrate 30, with a suitable epoxy 32 such as that sold under the trademark Ablestick by Ablestick Company, so that each detector element 34 is centered within an aperture 20 of the cold shield array (FIGS. 8, 9, 10 and 11).

The completed array of detectors 6 and the array 4 of individual cold shields are shown (FIG. 11) with one side connected by leads 36 to bonding pads 38. The bonding pads have bonded thereto leads 40 coupled to constant current sources (not shown). The sides opposite the power inlet sides of the detector elements are coupled through leads 42 to a plurality of common ground plates 44. Each common ground plate 44 being coupled common to a selected number of ground leads 42 such as, for example, five. In such an arrangement the detector elements, responsive to the thermal energy striking the detector elements, produce electrical currents representative of the thermal energy, and act as variable resistors to change the voltages across them. The voltage changes are amplified and applied to the electro-optics for processing into a visible display. The array 4 of individual cold shields limit the thermal energy detected by the detector elements substantially to that of the field of view described by the optics. Extraneous thermal energy is absorbed by the cold shield and thus can not contribute to the detector noise.

Although a single embodiment of the invention has been described herein in detail, it will be apparent to a person skilled in the art that various modifications to the details of construction shown and described may be made without departing from the scope of this invention.

What is claimed is:
1. A thermal energy receiver comprising:
    a. an optical scanner for scanning a scene emanating thermal energy, said optical scanner producing a field of view of the scene;
    b. an array of thermal energy semiconductor detectors mounted in the path of the field of view of the optical scanner for porducing electrical signals representative of the thermal energy impinging thereon;
    c. an array of thermal energy absorbing semiconductor elements mounted on the substrate of the array of semiconductor detectors with edges in preselected juxtaposition to the field of view path for absorbing any interfering thermal energy generated outside the field of view of the optical scanner to improve the signal to noise ratio of the semiconductor detector array;

d. cooling means for cooling the array of detectors and array of thermal energy absorbing semiconductor elements; and e. electro-optics coupled to the electrical output of the array of semiconductor detectors for forming a display of the scene scanned by the optical scanner.

2. A thermal energy receiver according to Claim 1 wherein the array of thermal energy absorbing semiconductor elements is a silicon array doped with a p-type dopant.

3. A thermal energy receiver according to Claim 2 wherein the p-type dopant for the silicon array is selected from the group consisting of boron, indium, and gallium.

4. A thermal energy receiver according to Claim 1 wherein the array of thermal energy absorbing semiconductor elements is selected from the group consisting of silicon and germanium.

5. A thermal energy receiver according to Claim 1 wherein the array of thermal energy absorbing elements is bonded to the supporting substrate of the array of thermal energy detectors whereby the detector elements of the array of thermal energy detectors are positioned within the apertures of the array of energy absorbing elements for substantial shielding against thermal energy generated outside the field of view of the optical scanner.

6. A method of fabricating an array of thermal energy absorbing elements for an array of thermal energy detectors of a thermal energy receiver comprising:

a. forming a hole pattern in an oxide coated surface of a silicon substrate doped with a p-type dopant and having a preselected crystal orientation; and b. preferentially etching the patterned holes through the p-type doped silicon substrate with a solution of potassium hydroxide.

7. A method of fabricating an array of thermal energy absorbing elements according to Claim 6 wherein the preselected crystal orientation of the silicon substrate for preferential etching is the <111> Miller indices.

8. A method of fabricating an array of thermal energy absorbing elements according to claim 7 wherein the preferential etchant is a 50 percent potassium hydroxide solution.

\* \* \* \* \*